United States Patent
Rousseau et al.

(10) Patent No.: US 9,234,915 B2
(45) Date of Patent: Jan. 12, 2016

(54) SIGNAL SENSING DEVICE AND CIRCUIT BOARDS

(75) Inventors: Letha Rousseau, Garland, TX (US); Richard Schumacher, Dallas, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 582 days.

(21) Appl. No.: 13/387,671

(22) PCT Filed: Dec. 2, 2009

(86) PCT No.: PCT/US2009/066322
§ 371 (c)(1),
(2), (4) Date: Jan. 27, 2012

(87) PCT Pub. No.: WO2011/068506
PCT Pub. Date: Jun. 9, 2011

(65) Prior Publication Data
US 2012/0119779 A1 May 17, 2012

(51) Int. Cl.
*G01R 31/28* (2006.01)
*G01R 1/067* (2006.01)

(52) U.S. Cl.
CPC ........ *G01R 1/06772* (2013.01); *G01R 31/2822* (2013.01)

(58) Field of Classification Search
None
See application file for complete search history.

(56) References Cited

U.S. PATENT DOCUMENTS

| | | | | |
|---|---|---|---|---|
| 5,726,566 | A * | 3/1998 | Quist et al. | 324/95 |
| 7,126,360 | B1 * | 10/2006 | Yang | 324/754.07 |
| 7,155,818 | B2 * | 1/2007 | Smith | 29/842 |
| 7,358,752 | B1 * | 4/2008 | Ramroopsingh et al. | 324/755.02 |
| 2004/0061513 | A1 | 4/2004 | Sweet et al. | |
| 2008/0186036 | A1 * | 8/2008 | Shumaker | 324/754 |

FOREIGN PATENT DOCUMENTS

| | | |
|---|---|---|
| CN | 101389183 A | 3/2009 |
| JP | 04-206845 | 7/1992 |
| JP | 1139959 A | 2/1999 |
| JP | 2001343406 A | 12/2001 |
| JP | 2003215210 | 7/2003 |
| JP | 2003232806 | 8/2003 |
| JP | 2004093334 | 3/2004 |
| KR | 20-1998-0024829 | 7/1998 |
| WO | WO-2009036320 | 3/2009 |

OTHER PUBLICATIONS

Machine English translation of Japanese Patent Publication to Inventor Shinichi Kioke. JP2001343406A, Dec. 14, 2001. Translation of pp. 2-5 created on May 1, 2015.*

(Continued)

*Primary Examiner* — Melissa Koval
*Assistant Examiner* — Stephen G Armstrong
(74) *Attorney, Agent, or Firm* — Hewlett Packard Enterprise Patent Department

(57) ABSTRACT

Apparatus are provided for use in testing circuit boards. A signal sensing device includes one or more probes. Each probe includes a length of rigid coaxial conductor configured to define a sensing pin at one end. A circuit board defines a number of through vias lined in metal and configured to receive the sensing pin of a corresponding probe. The signal sensing device also includes a ground pin. Electrical pathways extending away from adjacent pairs of the through vias can be tested for electrical impedance and other signal propagating characteristics by way of the signal sensing device.

17 Claims, 3 Drawing Sheets

(56) References Cited

OTHER PUBLICATIONS

IPO, Examination Report dated May 20, 2014, Patent App No. GB1202868.4, filed Dec. 2, 2009.

SIPO, Translation of Search Report dated Dec. 18, 2013, Patent App No. 200980162693.1 filed Dec. 2, 2009.

SIPO, Supplementary Search Report, dated Aug. 4, 2014, CN Patent App No. 200980162693.1.

* cited by examiner

SIGNAL SENSING DEVICE AND CIRCUIT BOARDS

BACKGROUND

Computers, wireless communication devices and numerous other apparatus generate and use signals operating near one gigahertz ($10^9$ hertz). Impedance and other characteristics of the circuit board signal pathways are of significant concern to designers working in this frequency realm. Testing of the circuit traces during prototyping and production verification is required to ensure proper design, fabrication and subsequent performance. The present teachings address the foregoing concerns.

BRIEF DESCRIPTION OF THE DRAWINGS

The present embodiments will now be described, by way of example, with reference to the accompanying drawings, in which.

DETAILED DESCRIPTION

Introduction

Means for measuring signal propagating characteristics of circuit traces on circuit boards are provided by the present teachings. A signal sensing device includes one or more probes. Each probe includes a length of rigid coaxial conductor configured to define a sensing pin at one end. A corresponding circuit board defines a number of through vias lined in metal and configured to receive the sensing pin of a corresponding probe. The signal sensing device also includes a ground pin. Electrical pathways extending away from through vias can be tested for electrical impedance and other signal propagating characteristics by way of the signal sensing device.

In one embodiment, an apparatus includes a probe. The probe includes a length of rigid coaxial conductor that is coupled to a mateable connector at one end, and configured to define a signal sensing pin at the other end. The length of rigid coaxial conductor is characterized by a metallic outer sheath. The apparatus also includes a ground pin that is electrically bonded to the metallic outer sheath of the rigid coaxial conductor.

In another embodiment, an apparatus includes a first probe and a second probe. Each of the first and second probes includes a length of rigid coaxial conductor characterized by a metallic note sheath. In turn, each length of rigid coaxial conductor is coupled to a mateable connector at one end and is configured to define a signal sensing pin at the other end. The respective metallic outer sheathes are electrically bonded together proximate to the signal sensing pins of the first and second probes.

In yet another embodiment, a system includes a circuit board that defines first through via and a second through via. Each of the through vias is lined in an electrically conductive material. The system also includes a signal sensing device that includes a first probe and a second probe. The first probe has a first pin configured to be contactingly received in the first through via. The second probe has a second pin configured to be contactingly received in the second through via.

First Illustrative Embodiment

Figure 1:
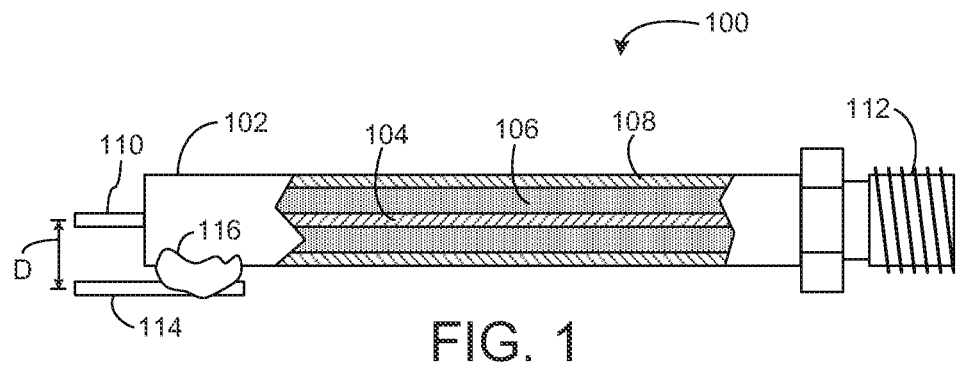
FIG. 1 depicts a partial cutaway view of a signal probe according to one embodiment.

Reference is now made to FIG. 1, which depicts a partial cutaway view of a signal probe (probe) 100 according to one embodiment. The probe 100 is illustrative and non-limiting with respect to the present teachings. Thus, other probes can be configured and/or operated in accordance with the present teachings.

The probe 100 includes a length of rigid coaxial conductor 102. As used herein, "rigid coaxial conductor" refers to such coaxial material as having sufficient stiffness to retain a preformed lengthwise shape without additional support. Thus, the rigid coaxial conductor 102 can be worked by tooling or other means into some particular curvilinear shape as needed or desired, and such shape will be retained during normal use of the probe 100. For purposes of simplicity of understanding, the probe 100 is depicted as having a completely linear form throughout its length. Other illustrative and non-limiting shapes can also be used. Examples of such shapes are depicted hereinafter.

The rigid coaxial conductor 102 is defined by a central conductor 104, a dielectric material 106 and a metallic outer sheath 108. In one non-limiting embodiment, the central conductor 104 and the outer sheath 108 are formed from (or include) copper. Other suitable materials can also be used such as, for non-limiting example, silver, aluminum, gold, etc. The dielectric material 106 surrounds the central conductor 104 and electrically isolates it from the outer sheath 108. In one embodiment, the rigid coaxial conductor 102 is selected to have a characteristic impedance of fifty Ohms. Other suitable rigid coaxial conductors can also be used.

The signal probe 100 is configured such that a portion of the central conductor 104 is exposed and extends outward to define a signal sensing portion, or pin, 110. The signal probe 100 further includes a mateable connector 112. The mateable connector 112 and the sensing portion 110 are at opposite ends of the probe 100. The mateable connector 112 is any suitable connector that is electrically bonded (connected) to the central conductor 104 and the metallic outer sheath 108. Electrical signals detected or sensed by the sensing portion 110 can be communicated to an external entity (i.e., an oscilloscope, signal analysis instrumentation, etc., not shown) by way of the mateable connector 112. Additionally, test (stimulus) signals can be transmitted from the sensing portion 110.

The signal probe 100 further includes a ground pin 114. The ground pin 114 is formed from electrically conductive material such as copper, aver, aluminum, gold, etc. Other suitable materials can also be used. In one embodiment, the ground pin 114 is defined by an outer diameter of twenty mils (i.e., twenty-thousandths of an inch). Other suitable dimensions can also be used. The ground pin 114 is mechanically and electrically bonded to the respective outer sheath of the probe 100 by way of solder 116. In one embodiment, the signal sensing pin 110 and the ground pin 114 are separated on-centers by a distance of eighty mils (i.e., eighty-thousandths of an inch). Other suitable separations can also be used.

Table 1 below provides illustrative and non-limiting dimensions and characteristics for the probe 100:

TABLE 1

Illustrative Probe 100

| Element | Description/Notes |
| --- | --- |
| Probe 100 | 150 millimeters overall length |
| Coaxial Conductor 102 | 50 Ohms impedance |
| Coaxial Conductor 102 | 80 mils outer diameter/copper |
| Central Conductor 104 | 20 mils outer diameter/copper |
| Sensing Portion 110 | 50 mils length exposed |
| Ground Pin 114 | 20 mils outer diameter/copper |
| Pin Separation "D" | 80 mils on-centers |

Second Illustrative Embodiment

Figure 2:
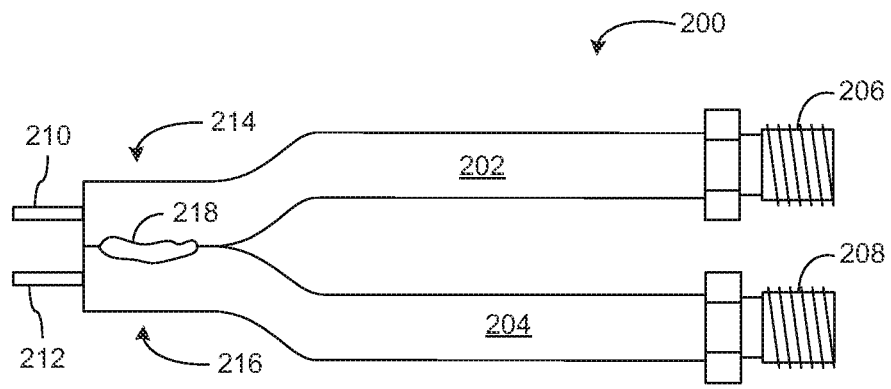
FIG. 2 depicts a plan view of a signal sensing device according to one embodiment.

Attention is now directed to FIG. 2, which depicts a plan view of a signal sensing device (device) 200 according to one embodiment. The signal sensing device 200 is suitable for use with a differential signal in which any common-mode signal component is not of concern. The device 200 is illustrative and non-limiting in nature. Thus, other signal sensing devices can also be configured and used in accordance with the present teachings.

The device 200 includes a first signal probe (probe) 202 and a second signal probe 204. Each of the probes 202 and 204 are substantially defined and configured as described above in regard to the probe 100. Thus, the probes 202 and 204 include respective mateable connectors 206 and 208.

The probes 202 and 204 further include respective signal sensing portions, or pins, 210 and 212. In this way, the device 200 includes two probes 202 and 204 that can operate independently for purposes of sensing electrical signals by way of the respective sensing portions 210 and 212. In one embodiment, the signal sensing pins 210 and 212 are separated by a distance of eighty mils (i.e., eighty-thousandths of an inch) on-centers. Other suitable separations can also be used.

The probes 202 and 204 are each defined by a curvilinear lengthwise shape and are bonded to each other along respective portions 214 and 216 by way of solder 218. Other bonding means can also be used. The result is that the outer sheathes of the probes 202 and 204 are mechanically and electrically joined together proximate the signal sensing portions 210 and 212. It is also noted that the curvilinear form of the probes 202 and 204 is such that the mateable connectors 206 and 208 are spaced apart from each other. This spacing of the mateable connectors 208 and 208 provides sufficient clearance for the connecting of signal wiring or cabling (not shown) there to.

Third Illustrative Embodiment

Figure 3:
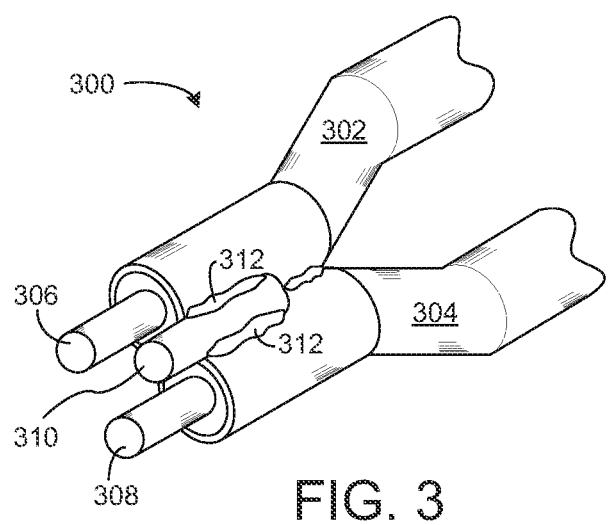
FIG. 3 depicts an isometric view of details of a signal sensing device according to another embodiment.

Reference is now made to FIG. 3, which depicts an isometric view of details of a signal sensing device (device) 300. The device 300 is suitable for use with signals in which both the differential and common-mode components are of interest or for simultaneously launching and receiving single-ended signals. The device 300 is illustrative and non-limiting in nature. Thus, other signal sensing devices can also be configured and used in accordance with the present teachings.

The device 300 includes a first probe 302 and a second probe 304. The probes 302 and 304 are defined and configured substantially as described above in regard to probes 202 and 204, respectively. The probes 302 and 304 include signal sensing portions (i.e., pins) 306 and 308, respectively. The probes 302 and 304 are joined together along respective portions proximate to the sensing portions 306 and 308. Thus, the device 300 is defined by two distinct signal sensing probes 302 and 304 that are bonded to define a singular apparatus.

The device 300 includes a ground pin 310. The ground pin 310 is formed from electrically conductive material such as copper, silver, aluminum, gold, etc. Other suitable materials can also be used. In one embodiment, the ground pin 310 is defined by an outer diameter of twenty mils (i.e., twenty-thousandths of an inch). Other suitable dimensions can also be used. The ground pin 310 is mechanically and electrically bonded to the respective outer sheathes of the probes 302 and 304 by way of solder 312.

The device 300 is configured so that three distinct electrical contacts can be made when the sensing pins 306 and 308 and the ground pin 310 are received within corresponding through vias described hereinafter. As the device 300 is essentially rigid and unitary in form, the respective pins 306, 308 and 310 are received (inserted) into respective through vias contemporaneously and by way of a single user effort. Additionally, the rigid nature of the device 300 maintains the equilateral spacing of the sensing pins 306 and 308 and the ground pin 310.

Fourth Illustrative Embodiment

Figure 4:
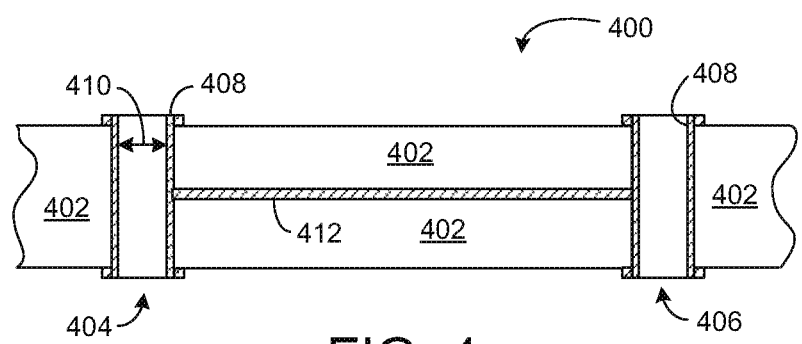
FIG. 4 depicts an elevation section view of a circuit board according to one embodiment.

Attention is now directed to FIG. 4, which depicts an elevation section view of circuit board 400. The circuit board 400 is illustrative and non-limiting with respect to the present teachings. Other circuit boards can also be used accordingly.

The circuit board 400 includes a substrate 402. The substrate 402 can be defined by any suitable electrically non-conductive material such as plastic, nylon, etc. Other suitable materials can also be used. One having ordinary skill in the electrical arts is familiar with typical materials used as circuit board substrate, and further elaboration is not required for an understanding of the present teachings.

The circuit board 400 is configured to define a through via 404 and a through via 406. Each of the through vias extends all the way through the substrate 402 and is lined with an electrically conductive material 408. The material 408 can be defined by (or include) copper, silver, aluminum, gold, etc. Other suitable metals or electrically conductive materials can also be used. In one embodiment, the through vias 404 and 406 and their respective linings 408 are defined by an internal diameter 410 of thirty mils (i.e., thirty-thousandths of an inch). Other suitable dimensions can also be used. The through vias and their conductive linings of the present teachings are also referred to as plated-through holes.

The circuit board 400 further includes a circuit trace 412 that electrically connects the conductive linings 408 of the respective through vias 404 and 406. The circuit trace 412 is supported within the substrate 402 at about midway through the thickness thereof. Other suitable placements for the circuit trace 412 can also be used. The circuit trace 412 can be formed (or include) copper, silver, gold, aluminum, etc. Other suitable metals or electrically conductive materials can also be used.

The circuit trace 412 is defined by one or more electrical characteristics relevant to the propagation of high frequency signals. Circuit trace 412 characteristics include impedance, signal reflectivity and other parameters. Such characteristics are determined or influenced by the circuit trace 412 material, dimensions, routing, or proximity to other circuit traces or entities. Other parameters can also affect the signal propagating behavior of the circuit trace 412. The electrical characteristics of the circuit trace 412 can be determined by the use of signal sensing devices (e.g., 200, etc.) of the present teachings and appropriate test instrumentation. Non-limiting examples of such testing include time-domain reflectometry (TDR), time-domain transmitometry (TDT), and so on.

Fifth Illustrative Embodiment

Figure 5:
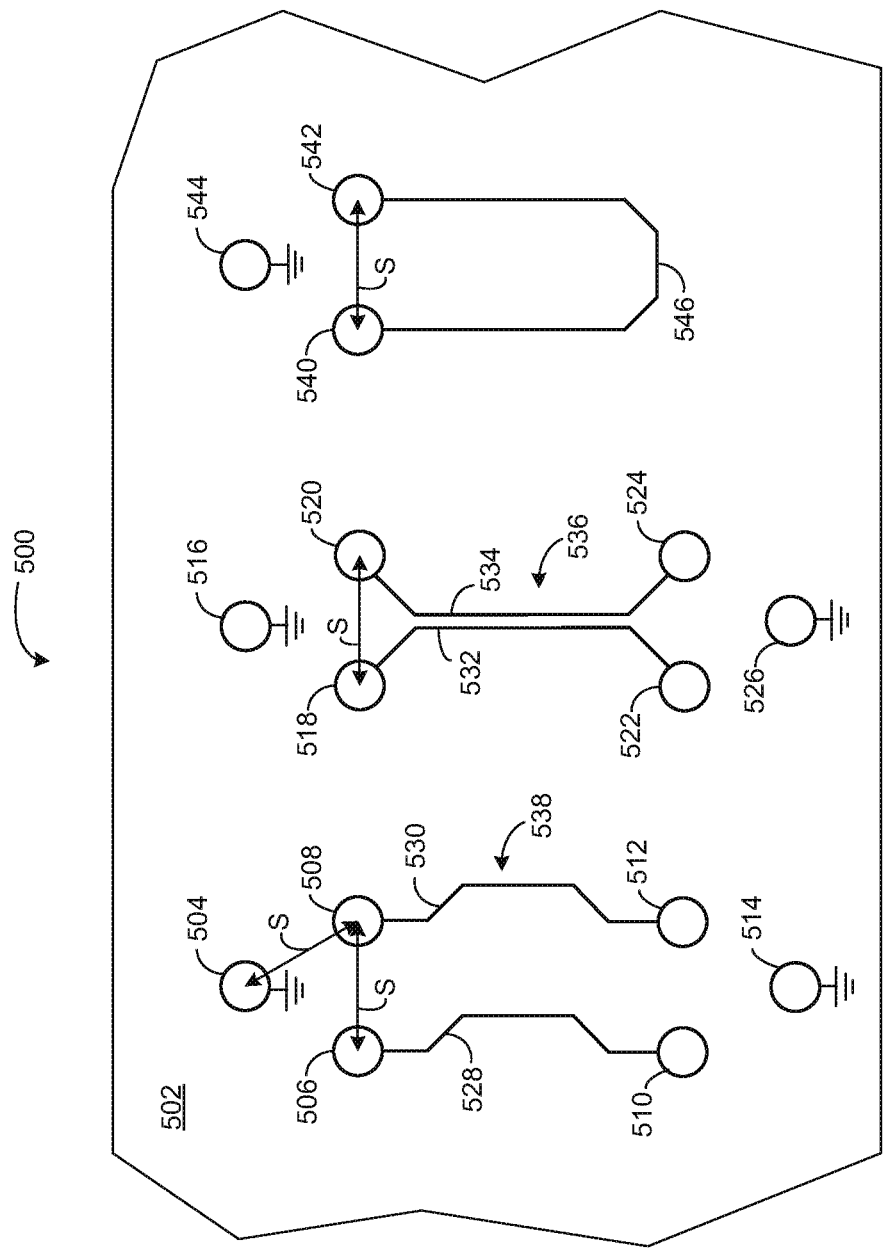
FIG. 5 depicts a plan view of a circuit board according to another embodiment.

Attention is now directed to FIG. 5, which depicts a plan view of circuit board 500. The circuit board 500 is illustrative and non-limiting with respect to the present teachings. Other circuit boards can also be used accordingly.

The circuit board 500 includes a substrate 502. The substrate 502 can be defined by any suitable electrically non-conductive material (plastic resin and glass fiber, etc.). The substrate 502 is configured to define a plurality of through vias 504-526, inclusive. Each of the through vias 504-526 includes an electrically conductive lining analogous to 408 described above. Thus, the through vias 504-526 are also referred to as plated-through holes 504-526. The electrically conductive linings of through vias 504, 514, 516 and 526 are electrically connected to a ground plane of the circuit board 500.

The through vias 504-526 are disposed such that associated groupings can be defined. For example, through vias 504, 506 and 508 define a triad having equilateral separations on-centers. In one embodiment, the on-centers separation distance "S" is eighty mils (i.e., eighty-thousandths of an inch). Other separation distances can also be used. These arrangements of associated through vias correspond to the geometry of the signal sensing pins and the ground pin (e.g., 306, 308 and 310, etc.) of a signal sensing device (e.g., 300, etc.) of the present teachings.

The circuit board 500 also includes a plurality of respective circuit traces or signal pathways 528-534, inclusive. Each of the circuit traces 528-534 is formed from an electrically conductive material such as copper, silver, gold, aluminum, doped semiconductor, etc. Other suitable materials can also be used. The circuit trace 528 electrically connects the conductive linings of through vias 506 and 510. Similarly, the circuit trace 530 electrically connects through vias 508 and 512, the circuit trace 532 electrically connects through vias 518 and 522, and the circuit trace 534 electrically connects through vias 520 and 524.

It is to be understood that the circuit traces 528-534 are respectively electrically connected (or coupled) to various electronic components and devices (not shown) of the circuit board 500. The circuit traces 528-534 thus operate as signal pathways between these components and devices during normal operation of the circuit board 500 (e.g., within a wireless apparatus, laptop computer, etc.).

It is noted that the circuit traces 532 and 534 have portions that run in close parallel proximity to each other. Thus, circuit traces 532 and 534 cooperatively define a differential pair 536. In turn, the circuit traces 528 and 530 run with relatively greater separation. As such, the circuit traces 528 and 530 cooperatively define a pair of single-ended traces 538. It is further noted that the respective circuit traces 528-534 are depicted as supported upon the outer surface of the substrate 502 in the interest of understanding the present teachings. However, it is to be undo stood that such circuit traces 528-534 or their analogs can be supported and routed within the substrate 502 of the circuit board 500. The circuit trace 412 of the circuit board 400 illustrates the immediately foregoing principle.

The circuit board 500 further includes through vias (i.e., plated-through holes) 540, 542 and 544, inclusive. As such, each of the through vias 540-544 includes an electrically conductive lining analogous to 408 described above. The electrically conductive lining of the through via 544 is electrically connected to a ground plane of the circuit board 500. The circuit board 500 also includes a circuit trace (i.e., signal pathway) 546. The circuit trace 546 is formed from an electrically conductive material such as copper, silver, gold, aluminum, doped semiconductor, etc. Other suitable materials can also be used. The circuit trace 546 electrically connects the conductive linings of the through vias 540 and 542. In this way, a signal sensing device (e.g., 300) can be used to launch and receive a single-ended test signal along the circuit trace 546 by way of the plated-through holes 540 and 542.

The spatial separation between parallel or adjacent circuit traces, as well as other factors, affects the impedance, close coupling and other signal propagating characteristics of those signal pathways. Testing and verification of such characteristics is performed by way of the through vias (e.g., 404, 406, 504-526, etc.) and the signal sensing devices (e.g., 100, 200, 300, etc.) of the present teachings.

First Illustrative System

Figure 6:
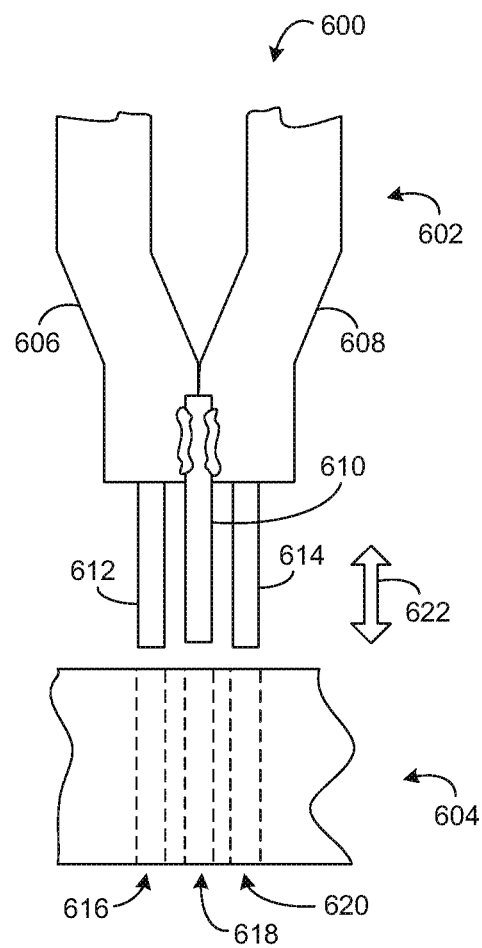
FIG. 6 depicts an elevation diagram of a system according to one embodiment.

FIG. 6 is an elevation diagram of a system 600 according to another embodiment. The system 600 is illustrative and non-limiting in nature. Other systems can be defined, configured and used in accordance with the present teachings.

The system 600 includes a signal sensing device 602 and a circuit board 604. The signal sensing device 602 is generally equivalent to the signal sensing device 300, and includes a first probe 606, a second probe 608 and a ground pin 610. The first probe 606 includes a sensing portion (or pin) 612, while the second probe 608 includes a sensing portion (pin) 614.

The circuit board 604 defines (or includes) respective through vias 616, 618 and 620. The through vies 616-620, inclusive, are generally equivalent to the plated-through holes 504-508, inclusive, as described above. The conductive linings of the through vias 616 and 620 are electrically connected to respective circuit pathways (not shown), while the conductive lining of the through via 618 is electrically connected to a ground plane of the circuit board 604.

The sensing pins 612 and 614 are configured to be contactingly received within the through vias 616 and 620, respectively. In turn, the ground pin 610 is configured to be contactingly received within the through via 618. Thus, the sensing device 602 can be cooperatively engaged and disengaged with the through vias 616-620 of the circuit board 604 as indicted by the bidirectional arrow 622. In this way, the relevant electrical characteristics of the circuit board 604 can be tested by way of the signal sensing device 602.

In accordance with the present teachings, and without limitation, various signal sensing devices can be defined and configured having a plurality of probes. Circuit boards can be correspondingly configured to include arrangements of electrically conductive plated-through holes (through vias). Such through vias are electrically connected to various circuit traces that carry signals during normal operation of a particular circuit board. The electrical characteristics of the circuit traces can be measured and evaluated by way of the signal sensing devices and corresponding through vias of the present teachings.

In general, the foregoing description is intended to be illustrative and not restrictive. Many embodiments and applications other than the examples provided would be apparent to those of skill in the art upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future embodiments. In sum, it should be understood that the invention is capable of modification and variation and is limited only by the following claims.

What is claimed is:

1. An apparatus, comprising:
a first probe and a second probe, each of the first and second probes including a length of rigid coaxial conductor characterized by a metallic outer sheath;
the first probe coupled to a mateable connector at one end and configured to define a signal sensing pin at the other end; and
a sheath-less ground pin electrically and mechanically bonded to the metallic outer sheathes of the first probe and the second probe, wherein the ground pin is located proximal to the other end of the first probe and the signal sensing pin, and extends a sub-portion of the length of the rigid coaxial conductor, wherein the sheath-less ground pin is directly bonded to the first probe with a first mechanical bond and directly bonded to the second probe with a second mechanical bond.

2. The apparatus of claim 1, comprising:
the second probe coupled to a different mateable connector at the one end and configured to define a different signal sensing pin at the other end.

3. The apparatus of claim 1, comprising:
the signal sensing pin, coupled to the first probe; and
a different signal sensing pin, coupled to the second probe.

4. The apparatus of claim 1 comprising:
the mateable connector at the one end of the first probe; and
a different mateable connector at the one end of the second probe.

5. An apparatus, comprising:
a first probe and a second probe, each of the first and second probes including a length of rigid coaxial conductor characterized by a metallic outer sheath, wherein:
the first probe is coupled to a first mateable connector at one end and configured to define a first signal sensing pin at the other end, and
the second probe is coupled to a second mateable connector at one end and configured to define a second signal sensing pin at the other end, the respective metallic outer sheathes of the first probe and the second probe being electrically bonded together proximate to the first and the second signal sensing pins; and
a sheath-less ground pin electrically and mechanically bonded to the metallic outer sheathes of the first probe and the second probe, wherein the ground pin is located proximal to the other end of the first probe and the other end of the second probe, and extends a sub-length of the full length of the rigid coaxial conductor, wherein the sheath-less ground pin is directly bonded to the first probe with a first mechanical bond and directly bonded to the second probe with a second mechanical bond.

6. The apparatus according to claim 5, each of the first and second probes formed such that the respective mateable connectors are spaced apart from each other.

7. The apparatus according to claim 5, each of the first probe and the second probe are characterized by a central conductor extending away from the rest of the respective rigid coaxial conductor so as to define the first signal sensing pin and the second signal sensing pin.

8. The apparatus according to claim 5, wherein the ground pin is mechanically and electrically bonded to the metallic outer sheathes of the first probe and the second probe via soldering the ground pin to the metallic outer sheathes.

9. The apparatus according to claim 8, the first signal sensing pin of the first probe and the second signal sensing pin of the second probe and the ground pin disposed in parallel arrangement.

10. The apparatus according to claim 8, the first signal sensing pin of the first probe and the second signal sensing pin of the second probe and the ground pin disposed in equidistant arrangement.

11. A system, comprising:
a circuit board defining a first through via and a second through via, each of the through vias lined in an electrically conductive material; and
a signal sensing device including a first probe and a second probe, the first probe having a first pin configured to be contactingly received in the first through via, the second probe having a second pin configured to be contactingly received in the second through via, wherein:
the first probe extends a full length of a first rigid coaxial conductor; and
the second probe extends a full length of a second rigid coaxial conductor, and the signal sensing device further includes:
a sheath-less ground pin mechanically and electrically bonded to the first probe and the second probe, wherein the sheath-less ground pin is directly bonded to the first probe with a first mechanical bond and directly bonded to the second probe with a second mechanical bond, wherein the ground pin is:
located at the other end of the first and the second rigid coaxial conductors proximal to the first and the second pins, and extends a sub-length of the full length of the first and the second rigid coaxial conductors.

12. The system according to claim 11, the first probe and second probe configured such that the first pin can be inserted into the first through via and the second pin can be inserted into the second through via contemporaneously.

13. The system according to claim 11, the first through via defined in spaced parallel adjacency with the second through via.

14. The system according to claim 11, the circuit board including a first circuit trace electrically coupled to the first through via and a second circuit trace electrically coupled to the second through via, at least a portion of the first circuit trace supported in spaced parallel adjacency with at least a portion of the second circuit trace.

15. The system according to claim 11, wherein the first rigid coaxial conductor of the first probe is configured to define the first pin, and the second rigid coaxial conductor of the second probe is configured to define the second pin.

16. The system according to claim 11, wherein the ground pin is disposed in parallel with the first pin and the second pin.

17. The system according to claim 16, the circuit board further defining a third through via, the signal sensing device configured such that the first pin and the second pin and the ground pin are contemporaneously receivable within the first through via and the second through via and the third though via, respectively.

* * * * *